(12) United States Patent
Hoshino et al.

(10) Patent No.: US 7,224,859 B2
(45) Date of Patent: May 29, 2007

(54) OPTO-ELECTRONIC INTEGRATED CIRCUIT DEVICE, OPTO-ELECTRONIC INTEGRATED CIRCUIT SYSTEM AND TRANSMISSION METHOD

(75) Inventors: Masataka Hoshino, Kawasaki (JP); Tomotoshi Sato, Mie (JP)

(73) Assignees: Fujitsu Limited, Kawasaki (JP); Sharp Corporation, Osaka (JP)

( * ) Notice: Subject to any disclaimer, the term of this patent is extended or adjusted under 35 U.S.C. 154(b) by 17 days.

(21) Appl. No.: 11/062,663

(22) Filed: Feb. 23, 2005

(65) Prior Publication Data
US 2005/0191004 A1 Sep. 1, 2005

(30) Foreign Application Priority Data
Feb. 26, 2004 (JP) .............................. 2004-051131

(51) Int. Cl.
*G02B 6/12* (2006.01)
(52) U.S. Cl. .............................. 385/14; 385/15; 385/16
(58) Field of Classification Search .................. 385/14, 385/15, 16
See application file for complete search history.

(56) References Cited

U.S. PATENT DOCUMENTS

| | | | |
|---|---|---|---|
| 5,731,887 A | * | 3/1998 | Fee .............................. 398/5 |
| 6,148,124 A | * | 11/2000 | Aksyuk et al. ............... 385/24 |
| 6,542,268 B1 | | 4/2003 | Rotolo et al. |
| 6,611,635 B1 | | 8/2003 | Yoshimura et al. |
| 6,647,208 B1 | | 11/2003 | Kirby |
| 6,690,847 B2 | | 2/2004 | Hsu |
| 2003/0048504 A1 | | 3/2003 | Halgren et al. |

FOREIGN PATENT DOCUMENTS

| | | |
|---|---|---|
| JP | 7-183570 | 7/1995 |
| JP | 2000-114581 | 4/2000 |
| JP | 2000-188418 | 7/2000 |
| WO | WO 02/42821 A1 | 5/2002 |

* cited by examiner

*Primary Examiner*—Jennifer Doan
(74) *Attorney, Agent, or Firm*—Arent Fox PLLC

(57) ABSTRACT

The opto-electronic integrated circuit device comprises an optical switch 18 provided in an input port 12a of a first input/output port 36a over a substrate 10 and changing over an optical path of an optical signal inputted from the input port 12a and outputting the optical signal through one of a plurality of output terminals 24a–24d; an opto-electric conversion element 26a optically connected to one of the plural output terminals of the optical switch 18, and converting the optical signal outputted from one of the output terminals 24a–24d of the optical switch 18 to an electric signal and inputting the converted electric signal in a semiconductor element 30 mounted over the substrate 10; and an optical waveguide 50 optically connected to another of the plural output terminal 24d of the optical switch 18 and outputting the optical signal outputted from said another output terminal 24d of the optical switch 18 through an output port 32b of a second input/output port 36b over the substrate 10.

6 Claims, 4 Drawing Sheets

OPTO-ELECTRONIC INTEGRATED CIRCUIT DEVICE, OPTO-ELECTRONIC INTEGRATED CIRCUIT SYSTEM AND TRANSMISSION METHOD

CROSS-REFERENCE TO RELATED APPLICATION

This application is based upon and claims priority of Japanese Patent Application No. 2004-51131, filed on Feb. 26, 2004, the contents being incorporated herein by reference.

BACKGROUND OF THE INVENTION

The present invention relates to an opto-electronic integrated circuit device, an opto-electronic integrated circuit system and a transmission method using the opto-electronic integrated circuit system.

Recently, opto-electronic integrated circuit devices each including optical elements and electronic devices integrated on a substrates are proposed. In the proposed opto-electronic integrated circuit device, the elements for converting electric signals to optical signals are, e.g., laser diodes, etc., and the elements for converting optical signals to electric signals are, e.g., photodiodes, etc. The optical elements are interconnected by optical fibers, etc., and the electronic devices are interconnected by electric interconnections.

Such opto-electronic integrated circuit device, which includes optical elements and electronic devices mounted on one and the same substrate, can be generally downsized and integrated.

Following references disclose the background art of the present invention.

[Patent Reference 1]

Specification of Japanese Patent Application Unexamined Publication No. 2000-114581 (pages 6–8, FIG. 1)

[Patent Reference 2]

Specification of Japanese Patent Application Unexamined Publication No. 2000-188418 (pages 4–5, FIG. 1)

[Patent Reference 3]

Specification of Japanese Patent Application Unexamined Publication No. 1995-183570 (pages 2–3, FIG. 1).

When, e.g., N (N is a natural number of 2 or more) opto-electronic integrated circuit devices thus proposed are arranged, and optical signals are transmitted among these opto-electronic integrated circuit devices, N×(N−1)/2 optical interconnections are necessary. (N−1) laser diodes and (N−1) photodiodes must be provided on each opto-electronic integrated circuit devices. Accordingly, it is not easy to form a system which enables the transmission of optical signals among a number of opto-electronic integrated circuit devices, and even when such system is formed, the system will be bulky. Then, in transmitting an optical signal from one opto-electronic integrated circuit device A to another opto-electronic integrated circuit B, it is an idea to transmit the optical signal via further another opto-electronic integrated circuit C, etc. However, in transmitting an optical signal via further another opto-electronic integrated circuit C, etc., the optical signal is converted to an electric signal, and the converted electric signal is further converted to the optical signal. Accordingly, when an optical signal is transmitted via a number of the opto-electronic integrated circuit devices, the delay of the signal is very large.

SUMMARY OF THE INVENTION

An object of the present invention is to provide an opto-electronic integrated circuit device which, even when an optical signal is transmitted between a number of the opto-electronic integrated circuit devices, the delay of the signal can be prevented, and which can be downsized; an opto-electronic integrated circuit system using the opto-electronic integrated circuit device; and a transmission method using three opto-electronic integrated circuit device system.

According to one aspect of the present invention, there is provided an opto-electronic integrated circuit device comprising: an optical switch disposed in an input port of a first input/output port over a substrate, and changing over an optical path of an optical signal inputted from the input port and outputting the optical signal from any one of a plurality of output terminals; an opto-electric conversion element optically connected to one of the plural output terminals of the optical switch, and converting the optical signal outputted from said one output terminal of the optical switch to an electric signal and inputting the converted electric signal into the a semiconductor element mounted over the substrate; and an optical waveguide optically connected to another of the plural output terminal of the optical switch, and outputting the optical signal outputted from said another output terminal of the optical switch through an output port of a second input/output port over the substrate.

According to another aspect of the present invention, there is provided an opto-electronic integrated circuit system comprising a plurality of opto-electronic integrated circuit devices arranged in a matrix, each opto-electronic integrated circuit device including an optical switch disposed in an input port of a first input/output port over a substrate, and changing over an optical path of an optical signal inputted from the input port and outputting the optical signal from any one of a plurality of output terminals; an opto-electric conversion element optically connected to one of the plural output terminals of the optical switch, and converting the optical signal outputted from said one output terminal of the optical switch to an electric signal and inputting the converted electric signal into a semiconductor element mounted over the substrate; an optical waveguide optically connected to another of the plural output terminal of the optical switch, and outputting the optical signal outputted from said another output terminal of the optical switch through an output port of a second input/output port over the substrate; an electric-optic conversion element converting an electric signal outputted from the semiconductor element to an optical signal and outputting the converted optical signal through the output port of the second input/output port; and the control part judging whether or not to permit the input of an optical signal to the input port of the first input/output port, outputting an electric signal indicating permission or prohibition of the input of the optical signal through the first input/output port and controlling the optical switch to change over the optical path of the optical signal, the output port of one of the plural opto-electronic integrated circuit devices and the input port of another of the plural opto-electronic integrated circuit devices being optically interconnected by an optical waveguide, and the control part of said one opto-electronic integrated circuit devices and the control part of said another opto-electronic integrated circuit devices being electrically interconnected by an electric interconnection.

According to further another aspect of the present invention, there is provided a transmission method using an opto-electronic integrated circuit system comprising a plurality of opto-electronic integrated circuit device arranged in a matrix, each opto-electronic integrated circuit device including an optical switch disposed in an input port of a first input/output port over a substrate, and changing over an optical path of an optical signal inputted from the input port and outputting the optical signal from any one of a plurality of output terminals; an opto-electric conversion element optically connected to one of the plural output terminals of the optical switch, and converting the optical signal outputted from said one output terminal of the optical switch to an electric signal and inputting the converted electric signal into the a semiconductor element mounted over the substrate; an optical waveguide optically connected to another of the plural output terminal of the optical switch, and outputting the optical signal outputted from said another output terminal of the optical switch through an output port of a second input/output port over the substrate; an electric-optic conversion element converting an electric signal outputted from the semiconductor element to an optical signal and outputting the converted optical signal through the output port of the second input/output port; and a control part judging whether or not to permit the input of an optical signal to the input port of the first input/output port, outputting an electric signal indicating permission or prohibition of the input of the optical signal through the first input/output port and controlling the optical switch to change over the optical path of the optical signal, the output port of a first opto-electronic integrated circuit device of the plural opto-electronic integrated circuit devices and the input port of a second opto-electronic integrated circuit device of the plural opto-electronic integrated circuits being optically interconnected by an optical waveguide, the output port of the second opto-electronic integrated circuit device and the input port of a third opto-electronic integrated circuit device of the plural opto-electronic integrated circuit devices being optically interconnected by an optical waveguide, the control part of the first opto-electronic integrated circuit device and the control part of the second opto-electronic integrated circuit device being electrically interconnected by an electric interconnection, and the control part of the second opto-electronic integrated circuit device and the control part of the third opto-electronic integrated circuit device being electrically interconnected by an electric interconnection, the method comprising: the first step of the first opto-electronic integrated circuit device asking the second opto-electronic integrated circuit device for the permission of the input of the optical signal to the input port of the second opto-electronic integrated circuit device; the second step of the second opto-electronic integrated circuit device asking the third opto-electronic integrated circuit device for the permission of the input of the optical signal to the input port of the third opto-electronic integrated circuit device; the third step of the control part of third opto-electronic integrated circuit device outputting an electric signal indicating the permission of the input of the optical signal to the control part of the second opto-electric integrated circuit device; the fourth step of the control part of the second opto-electronic integrated circuit device controlling the optical switch to output the optical signal inputted to the input port through the output port, and outputting an electric signal indicating the permission of the input of the optical signal to the input port to the control part of the first opto-electronic integrated circuit device; and the fifth step of inputting the optical signal outputted from the output port of the first opto-electronic integrated circuit device to the input port of the third opto-electronic integrated circuit device via the input port and the output port of the second opto-electronic integrated circuit device.

According to further another aspect of the present invention, there is provided a transmission method using an opto-electronic integrated circuit system comprising a plurality of opto-electronic integrated circuit device arranged in a matrix, each opto-electronic integrated circuit device including an optical switch disposed in an input port of a first input/output port over a substrate, and changing over an optical path of an optical signal inputted from the input port and outputting the optical signal from any one of a plurality of output terminals; an opto-electric conversion element optically connected to one of the plural output terminals of the optical switch, and converting the optical signal outputted from said one output terminal of the optical switch to an electric signal and inputting the converted electric signal into the a semiconductor element mounted over the substrate; an optical waveguide optically connected to another of the plural output terminal of the optical switch, and outputting the optical signal outputted from said another output terminal of the optical switch to an output port of a second input/output port over the substrate; an electric-optic conversion element converting an electric signal outputted from the semiconductor element to an optical signal and outputting the converted optical signal from the output port of the second input/output port; and the control part controlling the optical switch to change over the optical path of the optical signal, the output port of one of the plural opto-electronic integrated circuit devices and the input port of another one of the plural opto-electronic integrated circuit devices being optically interconnected by an optical waveguide, the control part changing over the optical path of the optical signal, based on a priority level of the optical signal inputted to the input port.

According to the present invention, when an optical signal inputted to one opto-electronic integrated circuit device is to be processed by said one opto-electronic integrated circuit the optical signal has been inputted to, the inputted optical signal can be converted to an electric signal and inputted to the semiconductor chip or others. When the inputted optical signal is to be processed by another opto-electronic integrated circuit device, the optical switch is changed over, and the inputted optical signal can be transmitted as it is to said another opto-electronic integrated circuit device. Thus, according to the present invention, a number of the optical waveguides, the electric-optic conversion elements and the opto-electric conversion elements are not necessary, which allows the opto-electronic integrated circuit system to be small sized. Furthermore, when an optical signal is to be processed by said another opto-electronic integrated circuit device, the optical signal is not converted to an electric signal and from the electric signal by the opto-electronic integrated circuit device the optical signal has been inputted to, which can prevent the decrease of the transmission speed. Thus, according to the present invention, even when an optical signal is transmitted between a large number of opto-electronic integrated circuit devices, the delay of the signal can be prevented, and the opto-electronic integrated circuit system can be small-sized.

According to the present invention, when an optical signal is transmitted via a number of opto-electronic integrated circuit devices, the optical signal is converted to an electric signal and converted to the optical signal by the opto-electronic integrated circuit devices the optical signal passes through in the transmission and is outputted, whereby the attenuated optical signal can be amplified. Thus, the present invention can provide the large-scale opto-electronic integrated circuit system wherein an optical signal passes through a number of the opto-electronic integrated circuit devices.

According to the present invention, when an optical signal inputted to an opto-electronic integrated circuit is to be processed by another opto-electronic integrated circuit, the opto-electronic integrated circuit the optical signal has been inputted to need not convert the optical signal to an electric signal or the electric signal to the optical signal, which can decrease the load of the processing of the opto-electronic integrated circuit devices to be decreased.

According to the present invention, when an optical signal inputted to an opto-electronic integrated circuit is to be processed by another opto-electronic integrated circuit, the opto-electronic integrated circuit device the optical signal has been inputted to does not convert the optical signal to an electric signal and the electric signal to the optical signal, which can decrease the electric power consumption.

DETAILED DESCRIPTION OF THE INVENTION

[An Embodiment]

Figure 1:
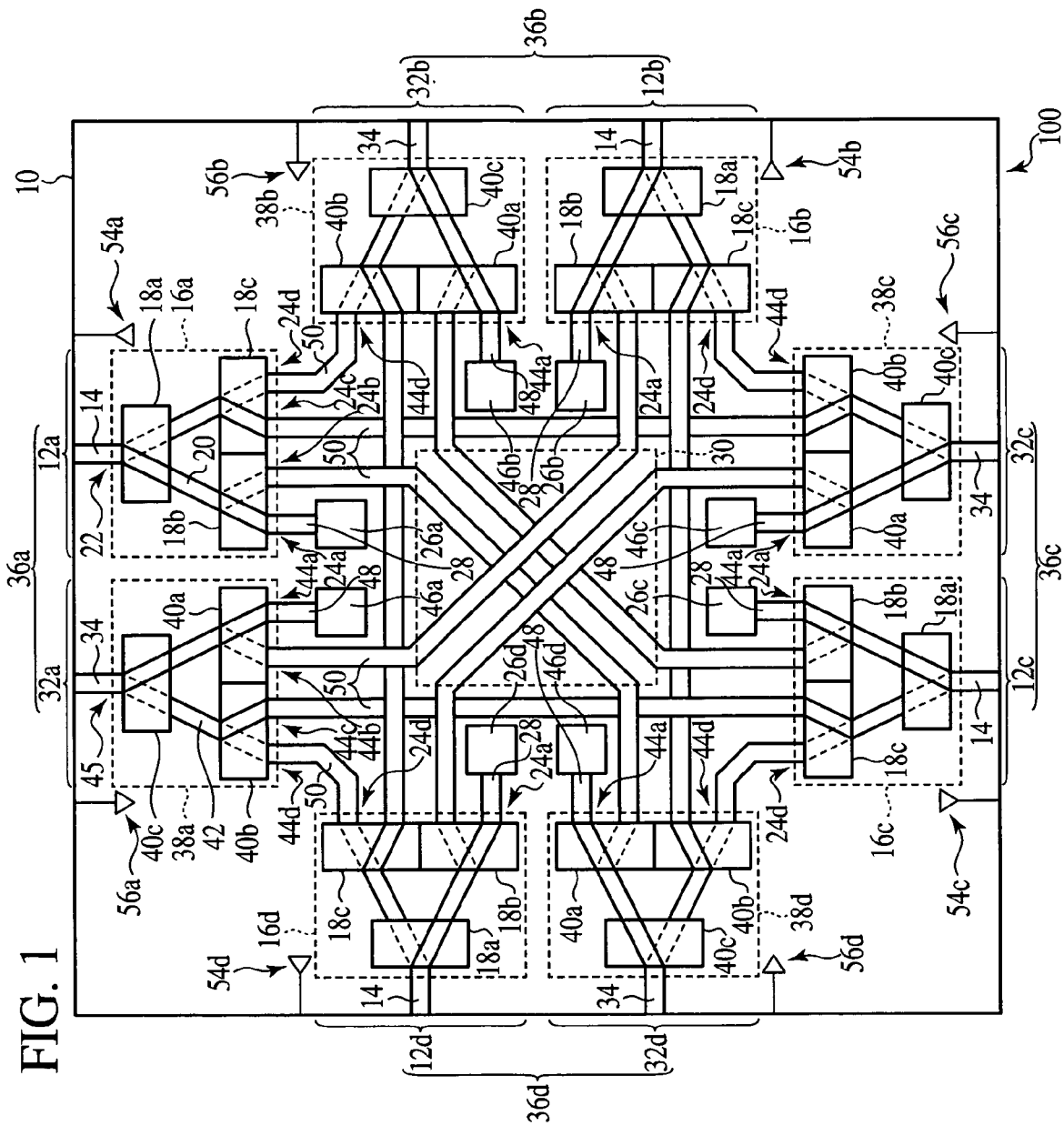
FIG. 1 is a plan view of the opto-electronic integrated circuit device according to one embodiment of the present invention.
Figure 2:
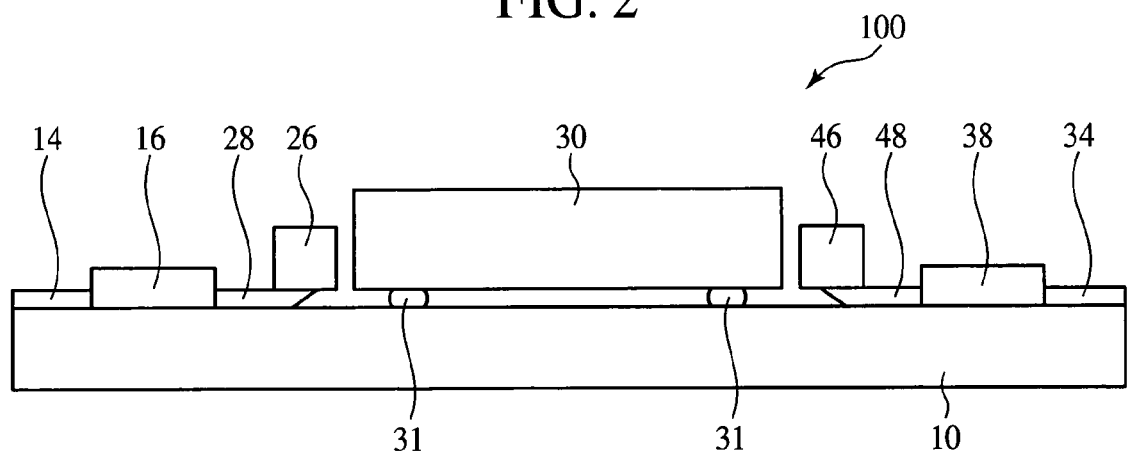
FIG. 2 is a sectional view of the opto-electronic integrated circuit device according to the embodiment of the present invention.
Figure 3:
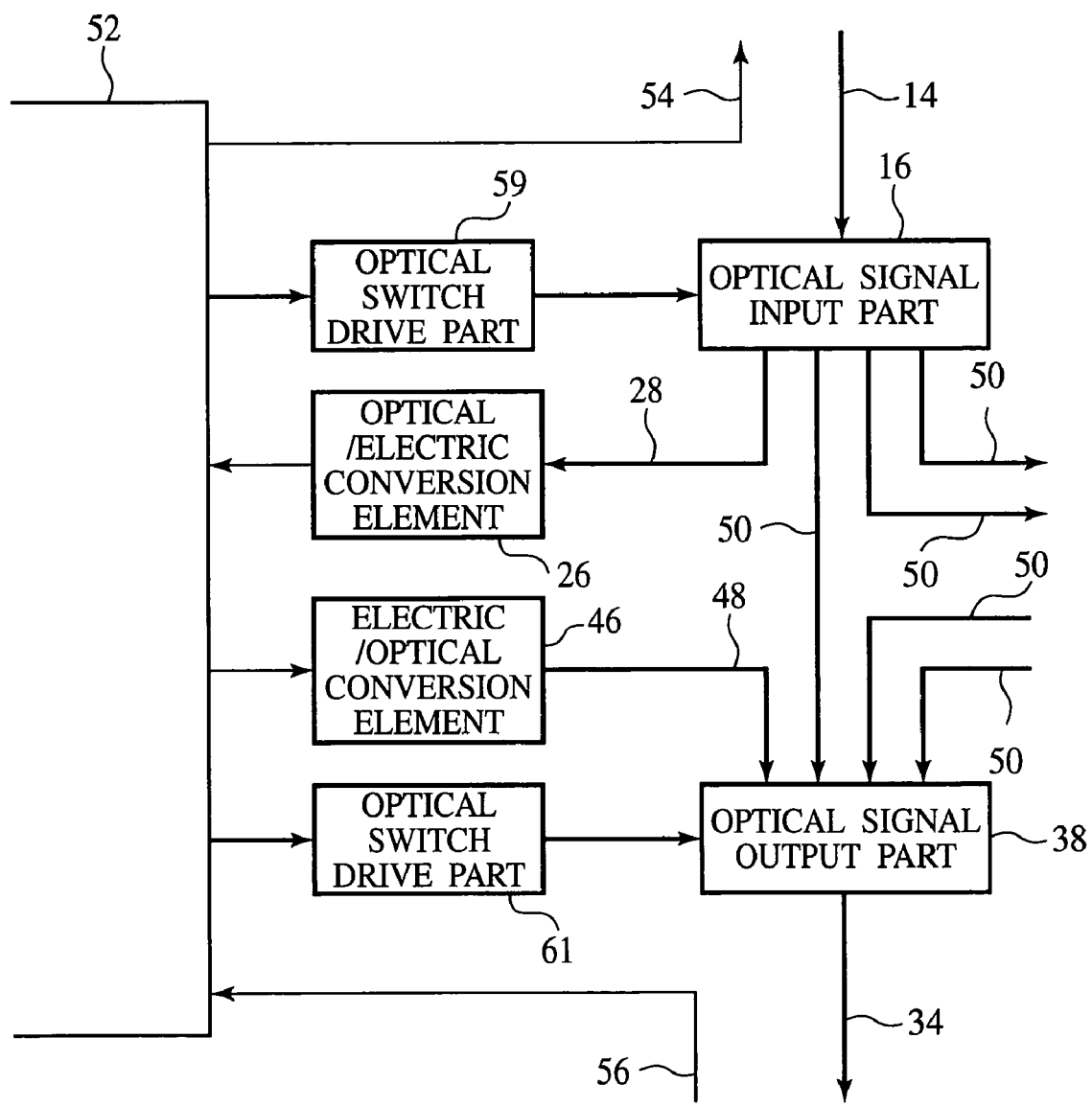
FIG. 3 is a circuit diagram of a part of the opto-electronic integrated circuit device according to the embodiment of the present invention.

An opto-electronic integrated circuit device, an opto-electronic integrated circuit system and a transmission method according to one embodiment of the present invention will be explained with reference to FIGS. 1 to 4. FIG. 1 is a plan view of the opto-electronic integrated circuit device according to the present embodiment. FIG. 2 is a sectional view of the opto-electronic integrated circuit device according to the present embodiment. FIG. 3 is a circuit diagram of a part of the opto-electronic integrated circuit device according to the present embodiment.

(The Opto-Electronic Integrated Circuit Device)

As illustrated, optical waveguides 14 are provided respectively in input ports 12a–12d on a substrate 10. The substrate 10 is, e.g., a silicon substrate, a ceramic substrate, a resin substrate (printed circuit board) or others. The optical waveguides 14 are for inputting optical signals from the outside.

Optical signal input parts 16a–16d are connected respectively to the optical waveguides 14. The optical signal input parts 16a–16d each comprise a combination of a plurality of optical switches 18a–18c. Each optical switch 18 outputs an optical signal inputted from one input terminal to either of 2 output terminals. The optical input parts 16a–16d each comprise the optical switches 18 cascade connected in two stages. The output terminal of the optical switch 18a in the first stage is optically connected to the input terminals of the optical switches 18b, 18c in the second stage by optical waveguides 20. An optical signal inputted to the input terminal of the optical switch 18a in the first stage is outputted from either of the two output terminals of the optical switch 18a in the first stage to be inputted to the input terminal of one of the two optical switches 18b, 18c in the second stage. The optical signal inputted to the input terminal of said one of the optical switch 18b, 18c in the second stage is outputted from either of the two output terminals of said one of the optical switch 18b, 18c in the second stage. Two optical switches 18b, 18c are provided in the second stage, and the total number of the output terminals of the optical switches 18b, 18c in the second stage is four. Accordingly, an optical signal inputted to the one input terminal (input end) 22 of the optical signal input part 16a is outputted from either of the four output terminals (output ends) 24a–24d of the optical signal input part.

Opto-electric conversion elements 26a–26d are provided respectively for the optical signal input parts 12a–12d. Opto-electric conversion elements 26a–26d are connected to the output terminals 24a of the optical signal input parts 16a–16d via optical waveguides 28. Optical signals outputted from the output terminals 24a of the optical signal input parts 16a–16d are inputted to the opto-electric conversion elements 26a–26d via the optical waveguides 28 to be converted to electric signals by the opto-electric conversion elements 26a–26d.

A semiconductor chip (semiconductor element) 30 is mounted on the substrate 10 (see FIG. 2). The semiconductor chip 30 is connected to an electrode (not illustrated) formed on the substrate by means of, e.g., solder bumps 31. On the semiconductor chip 30, a CPU, a memory, etc. are provided. The output terminals (not illustrated) of the opto-electric conversion elements 26a–26d are electrically connected to the input terminals (not illustrated) of the semiconductor chip 30 by means of electric interconnections (not illustrated). The output terminal of the opto-electric conversion element 26a and the output terminal of the semiconductor chip 30 may be interconnected by a solder bump or others. Optical signals inputted to the opto-electric conversion elements 26a–26d are converted to electric signals by the opto-electric conversion elements 26a–26d to be inputted to the semiconductor chip 30. It is possible that optical signals inputted to the opto-electric conversion elements 26a–26d are converted to electric signals by the opto-electric conversion elements 26a–26d to be inputted further to other semiconductor elements (not illustrated), etc. provided on the substrate 10.

Optical waveguides 34 are formed respectively in output ports 32a–32d on the substrate 10. The optical waveguides 34 are for outputting optical signals to the outside. The input ports 12a–12d and the output ports 32a–32d constitute input/output ports 36a–36d.

Optical output parts 38a–38d are connected to the optical waveguides 34. Each optical output part 38a–38d comprises a combination of a plurality of optical switches 40a–40c. Each optical switch 40a–40c outputs an optical signal inputted to either of two input terminals from one output terminal. The optical output parts 38a–38d each comprise the optical switches 40a–40c cascade connected in two stages. The output terminals of the optical switches 40a, 40b in the first stage and the input terminal of the optical switch 40c in the second stage are optically interconnected by optical waveguides 42. An optical signal inputted to either of the two input terminals of the optical switch 40a in the first stage is outputted from the output terminal of the optical switch 40a in the first stage to be inputted to one of the two input terminals of the optical switch 40c in the second stage. The optical signal inputted to either of the two input terminals of the optical switch 40b in the first stage is outputted from the output terminal of the optical switch 40b in the first stage to be inputted to the other of the two input terminals of the optical switch 40c in the second stage. An optical signal inputted to either of the two input terminals of the optical switch 40c in the second stage is outputted from the one output terminal of the optical switch 40c in the second stage. The optical switches 40a, 40b in the first stage are two, and the total number of the input terminals of the optical switches 40a, 40b in the first stage is four. Accordingly, an optical signal inputted to either of the four input terminals (input ends) 44a–44d of each optical signal output part 38a, 38d is outputted from the 1 output terminal (output end) 45 of each optical signal output part 38a–38d.

Electric-optic conversion elements 46a–46d are provided respectively in the optical signal output parts 38a–38d. The electric-optic conversion elements 46a–46d are connected respectively to the input terminals 44a of the optical signal output parts 38a–38d via optical waveguides 48. The electric-optic conversion elements 46a–46d are electrically connected to the semiconductor chip 30 via electric interconnections (not illustrated). Electric signals outputted from the semiconductor chip 30 are converted to optical signals by the electric-optic conversion elements 46a–46d to be inputted to the input terminals 44a of the optical signal output parts 38 via the optical waveguides 48. It is possible that electric signals outputted from other semiconductor elements (not illustrated) provided on the substrate are inputted further to the electric-optic conversion elements 46a–46d.

The output terminals 24b–24d of the optical signal input part 16, and the input terminals 44b–44d of the optical signal output parts 38 of the other input/output ports 36 are optically interconnected respectively via optical waveguides 50.

That is, the output terminal 24d of the optical signal input part 16a of a first input/output port 36a is optically connected to the input terminal 44d of the optical signal output part 38b of a second input/output port 36b via an optical waveguide 50. Accordingly, an optical signal outputted from the output terminal 24d of the optical signal input part 16a of the first input/output port 36a is inputted to the input terminal 44d of the optical signal output part 38b of the second input/output port 36b via the optical waveguide 50.

The output terminal 24c of the optical signal input part 16a of the first input/output port 36a is optically connected to the input terminal 44c of the optical signal output part 38c of a third input/output port 36c via an optical waveguide 50. Accordingly, an optical signal outputted from the output terminal 24c of the optical signal input part 16a of the first input/output port 36a is inputted to the input terminal 44c of the optical signal output part 38c of the third input/output port 36c via the optical waveguide 50.

The output terminal 24b of the optical signal input part 16a of the first input/output port 36a is optically connected to the input terminal 44b of the optical signal output part 38d of a fourth input/output port 36d via an optical waveguide 50. Accordingly, an optical signal outputted from the output terminal 24b of the optical signal input part 16a of the first input/output port 36c is inputted to the input terminal 44b of the optical signal output part 38d of the fourth input/output port 36d via the optical waveguide 50.

The output terminal 24d of the optical signal input part 16b of the second input/output port 36b is optically connected to the input terminal 44d of the optical signal output part 38c of the third input/output port 36c via an optical waveguide 50. Accordingly, an optical signal outputted from the output terminal 24d of the optical signal input part 16b of the second input/output port 36b is inputted to the input terminal 44d of the optical signal output part 38c of the third input/output port 36c via the optical waveguide 50.

The output terminal 24c of the optical signal input part 16b of the second input/output port 36b is optically connected to the input terminal 44c of the optical signal output part 38d of the fourth input/output port 36d via an optical waveguide 50. Accordingly, an optical signal outputted from the output terminal 24c of the optical signal input part 16b of the second input/output port 36b is inputted to the input terminal 44c of the optical signal output part 38d of the fourth input/output port 36d via the optical waveguide 50.

The output terminal 24b of the optical signal input part 16b of the second input/output port 36b is optically connected to the input terminal 44b of the optical signal output part 38a of the first input/output port 36a via an optical waveguide 50. Accordingly, an optical signal outputted from the output terminal 24b of the optical signal input part 16b of the second input/output port 36b is inputted to the input terminal 44b of the optical signal output part 38a of the first input/output port 36a via the optical waveguide 50.

The output terminal 24d of the optical signal input part 16c of the third input/output port 36c is optically connected to the input terminal 44d of the optical signal output part 38d of the fourth input/output port 36d. Accordingly, an optical signal outputted from the output terminal 24d of the optical signal input part 16c of the third input/output port 36c is inputted to the input terminal 44d of the optical signal output part 38d of the fourth input/output port 36d via the optical waveguide 50.

The output terminal 24c of the optical signal input part 16c of the third input/output port 36c is optically connected to the input terminal 44c of the optical signal output part 38a of the first input/output port 36a via an optical waveguide 50. Accordingly, an optical signal outputted from the output terminal 24c of the optical signal input part 16c of the third input/output port 36c is inputted to the input terminal 44c of the optical signal output part 38a of the first input/output port 36a via the optical waveguide 50.

The output terminal 24b of the optical signal input part 16c of the third input/output port 36c is optically connected to the input terminal 44b of the optical signal output part 38b of the second input/output port 36b via an optical waveguide 50. Accordingly, an optical signal outputted from the output terminal 24b of the optical signal input part 16c of the third input/output port 36c is inputted to the input terminal 44b of the optical signal output part 38b of the second input/output port 36 via the optical waveguide 50.

The output terminal 24d of the optical signal input part 16d of the fourth input/output port 36d is optically connected to the input terminal 44d of the optical signal output part 16a of the first input/output port 38a via an optical waveguide 50. Accordingly, an optical signal outputted from the output terminal 24d of the optical signal input part 16d of the fourth input/output port 38d is inputted to the input terminal 44d of the optical signal output part 38a of the first input/output port 36a via the optical waveguide 50.

The output terminal 24c of the optical signal input part 16d of the fourth input/output port 36d is optically connected to the input terminal 44c of the optical signal output part 38b of the second input/output port 38b via an optical waveguide 50. Accordingly, an optical signal outputted from the output terminal 24c of the optical signal input part 16d of the fourth input/output port 36d is inputted to the input terminal 44c of the optical signal output part 38b of the second input/output port 38b via the optical waveguide 50.

The output terminal 24b of the optical signal input part 16d of the fourth input/output port 36d is optically connected to the input terminal 44b of the optical signal output part 38c of the third input/output port 36c via an optical waveguide 50. Accordingly, an optical signal outputted from the output terminal 24b of the optical signal input part 16d of the fourth input/output port 36d is inputted to the input terminal 44b of the optical signal output part 38c of the third input/output port 36c via the optical waveguide 50.

A control part 52 (see FIG. 3) which generally controls the opto-electronic integrated circuit device according to the present embodiment is provided on the substrate 10. The control part 52 may be provided in the semiconductor chip 30 or mounted on the substrate 10 separate from the semiconductor chip 30.

Electric signal output parts 54a–54d are provided respectively in the input/output ports 36a–36d for outputting electric signals to the outside. Electric signals outputted from the electric signal output parts 54 are inputted to the electric signal input parts 56a–56d of the input/output ports 36 of other opto-electronic integrated circuit devices via electric interconnections 58 (see FIG. 4).

Electric signal input parts 56a–56d which receive electric signals from the outside are provided respectively in the input/output ports 36a–36d. Electric signals outputted from the electric signal output parts 54 of other opto-electronic integrated circuit devices are inputted to the electric signal input parts 56a–56d via electric interconnections 60 (see FIG. 4).

Electric signals outputted from the electric signal output parts 54a–54d are used to make responses, etc. to commands, etc. from other opto-electronic integrated circuit devices. For example, when optical signals demanding the permission of the input of optical signals are transmitted from other opto-electronic integrated circuit devices, the electric signal output parts 52a–54d make responses as to whether or not to permit the input of the optical signals to said other opto-electronic integrated circuit devices by means of electric signals. Electric signals can be used also to inform said other opto-electronic integrated circuit device of the completion of the receipt of the optical signals. To make responses, etc. to other opto-electronic integrated circuit devices, optical signals are not used, but electric signals are used so that the electric signal output parts 54a–54b can response to other opto-electronic integrated circuit devices without converting electric signals to optical signals. That is, demands from other opto-electronic integrated circuit devices are judged by the control part 52 provided in the opto-electronic integrated circuit device. A result of a judgment of the control part 52, which is electrically operative, is outputted in an electric signal from the control part 52. If the response is made to other opto-electronic integrated circuit devices in optical signals, the electric signals must be converted to optical signals, and the electric-optic conversion elements 46a–46d must be used, which increases the load of the processing of the electric-optic conversion elements 46a–46d, and the power consumption is increased. However, when a judgment result of the control part 52 is outputted by electric signals to other opto-electronic integrated circuit devices, the electric signals must not be converted to optical signals, which can prevent the increase of the processing load of the electric-optic conversion elements 46a–46d and can contribute to the decrease of the power consumption. Thus, electric signals are used to response to other opto-electronic integrated circuit devices. The responses, etc. to the demands, etc. from other opto-electronic integrated circuit devices have small information quantities, and use of electric signals makes no problem.

The electric signals inputted and outputted to and from the electric signal input parts 56a–56d and the electric signal output parts 54a–54d are, e.g., 3-bit type. The signal indicating the permission of the input of optical signals is, e.g., "100". The signal indicating the finish of the input of the optical signals is, e.g., "101". The signal indicating that the input of the optical signals is not admitted, i.e., the prohibition of the input of the optical signals is, e.g., "111". The signal indicating the detection of an error is, e.g., "110". When the electric signal is 3-bit type, the number of the electric interconnections 58 (see FIG. 4) connecting the electric signal output parts 54 to the electric signal input parts 56 of the other opto-electronic integrated circuit devices may be respectively, e.g., three, and the number of the electric interconnections 60 (see FIG. 4) connecting the electric signal input parts 56 to the optical signal output parts 54 of other opto-electronic integrated circuit devices may be respectively, e.g., three.

The electric signal may be serially transmitted. For example, it is possible that the leading 1 bit is a start bit to a synchronously transmit the electric signal. For the serial transmission, the number of the electric interconnections 58 (see FIG. 4) connecting the electric signal output parts 54 to the electric signal input parts 56 of the other opto-electronic integrated circuit devices is respectively, e.g., one, and the number of the electric interconnections 60 (see FIG. 4) interconnecting the electric signal input parts 56 to the electric signal output parts 54 of the other opto-electronic integrated circuit devices is respectively, e.g., one.

The control part 52 judges whether or not to permit the input of an optical signal, based on, e.g., a state of the optical switches 18a–18c of the optical signal input parts 16a–16d, a state of the optical switches 40a–40c of the optical signal output parts 38a–38d, an operational state of the electric-optic conversion elements 46a–46d, etc.

Based on, e.g., a priority level of an optical signal, the control part 52 controls the optical switches 18a–18c of the optical signal input parts 16a–16d, the optical switches 40a–40c of the optical signal output parts 38a–38d, etc. The header of data of an optical signal includes data indicating a priority level. For example, when a priority level of an optical signal whose input is demanded and a priority level of data being processed by the semiconductor chip 30, the control part 52 or others, are compared with each other, and the former is higher by above a prescribed value than the latter, the optical signal is inputted to the semiconductor chip 30 or others via the opto-electric conversion elements 26. On the other hand, unless the priority level of the optical signal whose input is demanded is higher by above the prescribed value than the priority level of the data being processed by the semiconductor chip 30 or others, the input of the optical signal to the optical signal input parts 16 is rejected, or the optical signal to be inputted to the optical signal input parts 16 is outputted from the optical signal output parts 38 of another input/output ports 36.

As illustrated in FIG. 3, optical switch driving parts 59 are connected respectively to the optical signal input parts 16. The optical switch drive parts 59 drive the optical switches 18a–18c (see FIG. 1) provided in the optical signal input parts 16. The optical switch drive parts 59 are connected to the control part 52.

Optical switch driving parts 61 are connected respectively to the optical signal output parts 38. The optical switch drive parts 61 drive the optical switches 40a–40c (see FIG. 1) of the optical signal output parts 38. The optical switches 61 are connected to the control part 52.

The optical switch drive parts 59, 61 drive the optical switches 18a–18c, 40a–40c, based on electric signals inputted from the control part 52 to the optical switch drive parts 59, 61. The respective optical switches 18a–18c, 40a–40c may be interlocked to be changed over or may be individually changed over. The respective optical switches 18a–18c, 40a–40c are interlocked to be switched, whereby the number of states of the optical switches 18a–18c, 40a–40c to be stored can be made small, and also the control can be made simple.

For example, when an optical signal inputted to the optical signal input part 16a of the first input/output port 36a is outputted from the optical signal output part 38b of the second input/output port 36b, the optical switches 18a–18c of the optical signal input part 16a of the first input/output port 36a are set so that the optical signal inputted to the input terminal 22 of the optical signal input part 16a of the first input/output port 36a is outputted from the output terminal 24d of the optical signal input part 16a of the first input/output port 36a, and the optical switches 40a–40c of the optical signal output part 38b of the second input/output port 36b are set so that the optical signal inputted to the input terminal 44d of the optical signal output part 38b of the second input/output port 36b is outputted from the output terminal 45 of the optical signal output part 38b of the second input/output port 36b. An electric signal indicating the permission of the input of the optical signal is outputted from the electric signal output part 54a of the first input/output port 36a. Then, the optical signal inputted to the optical signal input part 16a of the first input/output port 36a is outputted from the optical signal output part 38b of the second input/output port 36b via the optical waveguide 50.

When an optical signal inputted to the optical signal input port 16a of the first input/output port 36a is outputted from the optical signal output part 38c of the third input/output port 36c, the optical switches 18a–18c of the optical signal input part 16a of the first input/output port 36a are set so that the optical signal inputted to the input terminal 22 of the optical signal input part 16a of the first input/output port 36a is outputted from the output terminal 24c of the optical signal input part 16a of the first input/output port 36a, and the optical switches 40a–40c of the optical signal output part 38c of the third input/output port 36c are set so that the optical signal inputted to the input terminal 44c of the optical signal output part 38c of the third input/output port 36c is outputted from the output terminal 45 of the optical signal output part 38c of the third input/output port 36c. An electric signal indicating the permission of the input of the optical signal is outputted from the electric signal output part 54a of the first input/output port 36a. Then, the optical signal inputted to the optical signal input part 16a of the first input/output port 36a is outputted from the optical signal output part 38c of the third input/output port 36c via the optical waveguide 50.

When an optical signal inputted to the optical signal input part 16a of the first input/output port 36a is outputted from the optical signal output part 38d of the fourth input/output port 36d, the optical switches 18a–18c of the optical signal input part 16a of the first input/output port 36a are set so that the optical signal inputted to the input terminal 22 of the optical signal input part 16a of the first input/output port 36a is outputted from the output terminal 24b of the optical signal input part 16a of the first input/output port 36a, and the optical switches 40a–40d of the optical signal output part 38d of the fourth input/output port 36d are set so that the optical signal inputted to the input terminal 44b of the optical signal output part 38d of the fourth input/output port 36d is outputted from the output terminal 45 of the optical signal output part 38d of the fourth input/output port 36d. An electric signal indicating the permission of the input of the optical signal is outputted from the electric signal output part 54a of the first input/output port 36a. Then, the optical signal inputted to the optical signal input part 16a of the first input/output port 36a is outputted from the optical signal output part 38d of the fourth input/output port 36d via the optical waveguide 50.

When an optical signal inputted to the optical signal input part 16b of the second input/output port 36b is outputted from the optical signal output parts 38a, 38c, 38d of the other input/output ports 36a, 36c, 36d, when an optical signal inputted to the optical signal input part 16c of the third input/output port 36c is outputted from the optical signal output parts 38a, 38b, 38d of the other input/output ports 36a, 36b, 36d, and when an optical signal inputted to the optical signal input part 16d of the fourth input/output port 36d is outputted from the optical signal output ports 38a–38c of the fourth input/output port 36c, the optical switches 18a–18c, 40a–40c are suitably set in the same way as described above.

In the above, the optical signal output parts 38a–38d each comprise the optical switches 40a–40c but may each comprise optical multiplexers.

For example, the optical signal output parts 38a–38d may each comprise a combination of a plurality of optical multiplexers each outputting from one output terminal an optical signal inputted from either of two input terminals. The optical signal output parts 38a–38d may each comprise a optical multiplexers outputting from one output terminal an optical signal inputted from four input terminals.

The optical signal output parts 38a–38d each comprise optical multiplexers, which makes it unnecessary to control the optical switches of the optical signal output parts 38a–38d. The control can be accordingly simplified.

Thus, the opto-electronic integrated circuit device 100 according to the present embodiment is constituted.

(The Opto-Electronic Integrated Circuit System)

Figure 4:
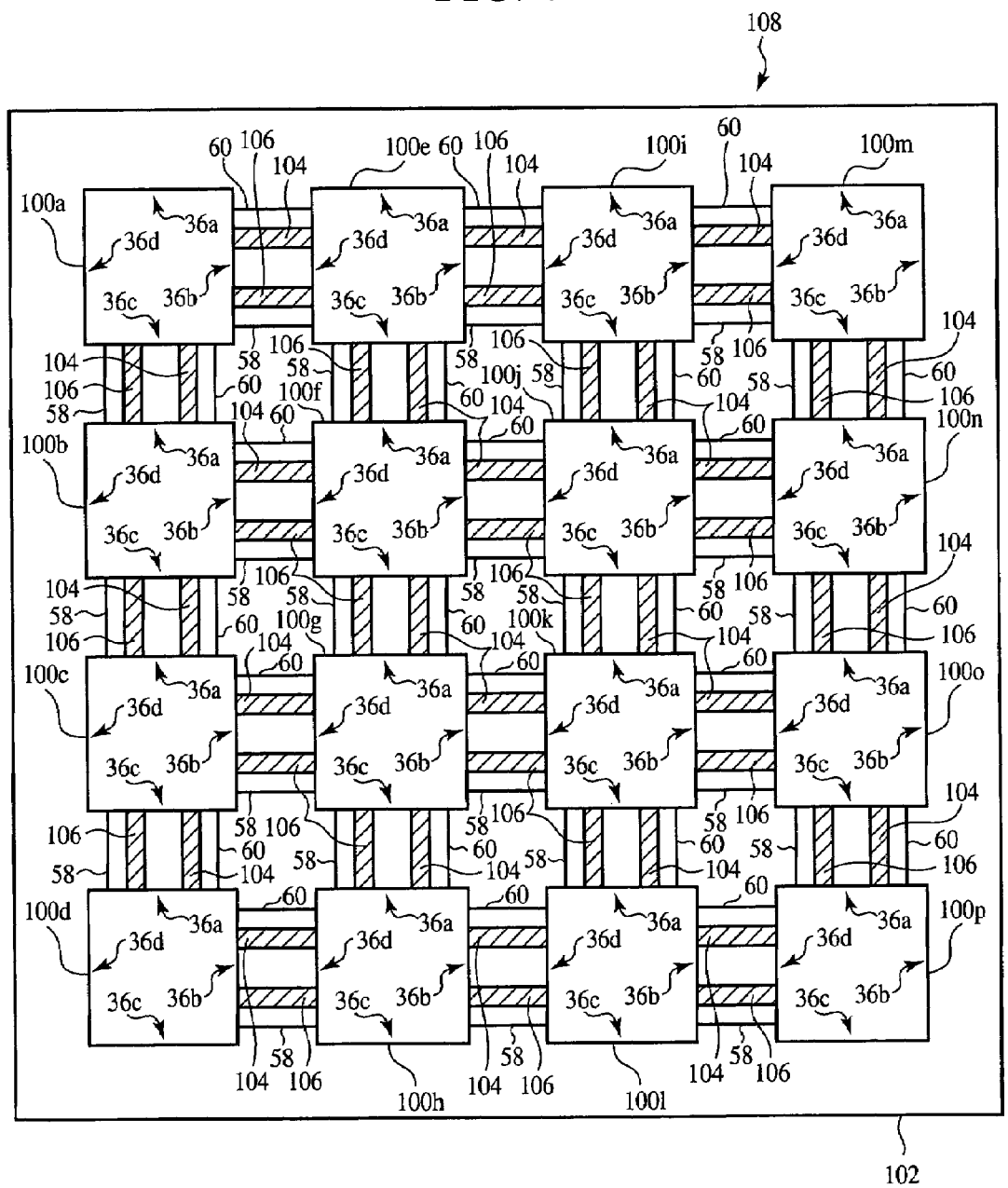
FIG. 4 is a conceptual plan view of the opto-electronic integrated circuit system according to the embodiment of the present invention.

Next, the opto-electronic integrated circuit system using the opto-electronic integrated circuit device according to the present embodiment will be explained with reference to FIG. 4. FIG. 4 is a conceptual plan view of the opto-electronic integrated circuit system according to the present embodiment.

As illustrated in FIG. 4, opto-electronic integrated circuit devices 100a–100p are arranged in a matrix.

The optical signal input parts 16 and the optical signal output parts 38 of the optoelectronic integrated circuit devices 100 adjacent to each other are respectively connected to each other by optical waveguides 104, 106. For the connection between the optical signal input parts 16 and the optical waveguides 104, 106 and the connection between the optical signal output parts 38 and the optical waveguides 104, 106, optical connectors (not illustrated), for example, are used.

The electric signal input parts 56 and the electric signal output parts 54 of the opto-electronic integrated circuit devices 100 adjacent to each other are respectively connected by the electric interconnections 58, 60. For the connection between the electric signal input parts 56 and the electric interconnections 58, 60 and the connection between the electric signal output parts 54 and the electric interconnections 58, 60, connectors (not illustrated), for example, are used. The connection between the electric signal input parts 56 and the electric interconnections 58, 60 and the connection between the electric signal output parts 54 and the electric interconnections 58, 60 may be made by solder bumps or others.

Thus, the opto-electronic integrated circuit system 108 according to the present embodiment is constituted.

Next, the transmission method using the opto-electronic integrated circuit system 108 according to the present embodiment will be explained.

The transmission method will be explained by means of the case that data is transmitted from the opto-electronic integrated circuit device 100a to the opto-electronic integrated circuit device 100g.

When data in an optical signal is transmitted from the opto-electronic integrated circuit device 100a to the opto-electronic integrated circuit device 100g, the shortest routes are to the optoelectronic integrated circuit device 100g via the opto-electronic integrated circuit device 100b and the opto-electronic integrated circuit device 100c, to the opto-electronic integrated circuit device 100g via the opto-electronic integrated circuit device 100b and the opto-electronic integrated circuit device 100f, and to the opto-electronic integrated circuit device 100g via the opto-electronic integrated circuit device 100e and the opto-electronic integrated circuit device 100f.

When an optical signal is transmitted via the opto-electronic integrated circuit device 100b and the opto-electronic integrated circuit device 100c, the control part 52 (see FIG. 1) of the opto-electronic integrated circuit device 100a outputs an optical signal to the opto-electronic integrated circuit 100b for the permission of the input to the optical signal by the opto-electronic integrated circuit device 100b. The optical switches 18a–18c of the optical signal input parts 16a–16d are set, in the initial state, so that an optical signal inputted to the optical signal input parts 16a–16d are inputted to the opto-electric conversion elements 26a–26d. Accordingly, the optical signal inputted to the optical signal input part 16a of the input/output port 36a of the opto-electronic integrated circuit device 100b is inputted to the opto-electric conversion element 26a and converted to the electric signal by the opto-electric conversion element 26a and the converted electric signal is inputted to the control part 52 (see FIG. 3).

The header of the optical signal inputted to the opto-electronic integrated circuit device 100b has data which indicates the optical signal is to be transmitted to the opto-electronic integrated circuit device 100g. The respective opto-electronic integrated circuit devices 100 has IDs, and the control part 52 of the opto-electronic integrated circuit device 100b can judge whether or not the inputted optical signal is to be processed by the opto-electronic integrated circuit device 100b or by the opto-electronic integrated circuit device 100g. The data of the IDs of the respective opto-electronic integrated circuit devices 100 may be stored in memories provided in the semiconductor chips 30 or memory means, such as ROMs or others, mounted on the substrate 10 separate from the semiconductor chips 30. The control part 52 of the opto-electronic integrated circuit device 100b judges whether or not the optical signal inputted from the optical signal input part 16a of the input/output port 36a can be outputted from the optical signal output part 16c of the input/output port 36c via the optical waveguide 50 and if possible, outputs an optical signal which demands the permission of the input of the optical signal to the opto-electronic integrated circuit device 100c. The control part of the opto-electronic integrated circuit device 100b judges whether or not to permit the input of the optical signal from the opto-electronic integrated circuit device 100a, based on set states of the optical switches 18a–18c of the optical signal input parts 16a–16d, set states of the optical switches 40a–40c of the optical signal output parts 38a–38d, operational states of the electric-optic conversion elements 46a–46d, a priority level of the optical signal, etc.

The header of the optical signal inputted to the opto-electronic integrated circuit device 100c has data indication that the optical signal is to be transmitted to the opto-electronic integrated circuit device 100g. The control part 52 of the opto-electronic integrated circuit device 100c judges whether or not the optical signal inputted from the optical signal input part 16a of the input/output port 36a can be outputted from the optical signal output part 16b of the input/output port 36b via the optical waveguide 50 and, if possible, outputs an optical signal demanding the permission of the input of the optical signal to the opto-electronic integrated circuit device 100g.

The header of the optical signal inputted to the opto-electronic integrated circuit device 100g has data indicating the optical signal is to be transmitted to the opto-electronic integrated circuit device 100g. The control part of the opto-electronic integrated circuit device 100g recognizes that the inputted optical signal is data to be processed by the opto-electronic integrated circuit device 100g. When the opto-electronic integrated circuit device 100g can receive the optical signal, the control part 52 of the opto-electronic integrated circuit device 100g outputs an electric signal indicating the permission of the input of the optical signal to the opto-electronic integrated circuit device 100c via the electric signal output part 54d.

The electric signal outputted from the electric signal output part 54d of the opto-electronic integrated circuit device 100g is inputted to the electric signal input part 56b of the opto-electronic integrated circuit device 100c. The control part 52 of the opto-electronic integrated circuit device 100c reads the electric signal inputted from the electric signal input part 56b and recognizes that the opto-electronic integrated circuit device 100g has permitted the input of the optical signal. The control part 52 of the opto-electronic integrated circuit device 100c sets the optical switches 18a–18c of the optical signal input part 16a and the optical switches 40a–40c of the optical signal output part 38b so that the optical signal inputted from the optical signal input part 16a of the input/output port 36a is outputted from the optical signal output part 38b of the input/output port 36b. The control part 52 of the opto-electronic integrated circuit device 100c outputs an electric signal indicating the permission of the input of the optical signal to the opto-electronic integrated circuit device 100b via the electric signal output part 54a.

The electric signal outputted from the electric signal output part 54b of the opto-electronic integrated circuit device 100c is inputted to the electric signal input part 56c of the opto-electronic integrated circuit device 100b. The control part 52 of the opto-electronic integrated circuit device 100b reads the electric signal inputted from the electric signal input part 56c and recognizes that the opto-electronic integrated circuit device 100b and the opto-electronic integrated circuit device 100g have permitted the input of the optical signal. The control part 52 of the opto-electronic integrated circuit device 100b changes over the optical switches 18a–18c of the optical signal input part 16a and the optical switches 40a–40c of the optical signal output part 38c so that the optical signal inputted from the optical signal input part 16a of the input/output port 36a is outputted from the optical signal output part 38*c* of the input/output port 36*c*. Then, the control part of the opto-electronic integrated circuit device 100*b* outputs an electric signal indicating the permission of the input of the optical signal to the opto-electronic integrated circuit 100*a* via the electric signal output part 54*a*.

The control part 52 of the opto-electronic integrated circuit device 100*a* reads the electric signal inputted from the electric signal input part 56*c* and recognizes that the opto-electronic integrated circuit device 100*b*, the opto-electronic integrated circuit device 100*c* and the opto-electronic integrated circuit device 100*g* have permitted the input of the optical signal. The control part 52 of the opto-electronic integrated circuit device 100*a* sets the optical switches 40*a*–40*c* of the optical signal output part 38*c* so that the electric signal outputted from the semiconductor chip 30 is converted to an optical signal by the electric-optic conversion element 46*c* to be outputted form the optical signal output part 38*c*.

The semiconductor chip 30 of the opto-electronic integrated circuit device 100*a* outputs an electric signal. The electric signal outputted from the semiconductor chip 30 is converted to an optical signal by the electric-optic conversion element 46*c* and outputted via the optical signal output part 38*c* of the input/output port 36*c*.

The optical signal outputted from the input/output port 36*c* of the opto-electronic integrated circuit device 100*a* is inputted to the opto-electronic integrated circuit device 100*g* via the opto-electronic integrate circuit 100*b* and the opto-electronic integrate circuit device 100*c*. The optical signal transmitted to the opto-electronic integrated circuit device 100*g* is subjected to required processing by the semiconductor chip 30, etc. mounted on the opto-electronic integrated circuit device 100*g*.

An optical signal contains data indicating the tail of the optical signal. The opto-electronic integrated circuit device 100*g* receives the data indicating the tail of the optical signal and outputs an electric signal indicating the completion of the transmission of the optical signal to the opto-electronic integrated circuit device 100*c* via the electric signal output part 54*d* so as to inform the opto-electronic integrated circuit device 100*c* of the completion of the transmission of the optical signal. The control part 52 of the opto-electronic integrated circuit device 100*g* resets the settings of the optical switches 18*a*–18*c* of the optical signal input parts 16*a*–16*d* and the optical switches 40*a*–40*c* of the optical signal output parts 38*a*–38*d*.

An electric signal indicating the completion of the transfer of the optical signal is inputted to the opto-electronic integrated circuit device 100*c* via the electric signal input part 56*b*. The opto-electronic integrated circuit device 100*c* outputs an electric signal indicating the completion of the transfer of the optical signal to the opto-electronic integrated circuit device 100*b* via the electric signal output part 54*a* so as to inform the opto-electric integrated circuit device 100*b* of the completion of the transfer of the optical signal. The control part 52 of the opto-electronic integrated circuit device 100*c* resets the settings of the optical switches 18*a*–18*d* of the optical signal input parts 16*a*–16*d* and the optical switches 40*a*–40*d* of the optical signal output parts 38*a*–38*d*.

An electric signal indicating the completion of the transfer of the optical signal is inputted to the opto-electronic integrated circuit device 100*b* via the electric signal input part 56*c*. The opto-electronic integrated circuit device 100*b* outputs an electric signal indicating the completion of the transfer of the optical signal to the opto-electronic integrated circuit device 100*a* via the electric signal output part 54*a* so as to inform the opto-electric integrated circuit device 100*a* of the completion of the transfer of the optical signal. The control part 52 of the opto-electronic integrated circuit device 100*b* resets the settings of the optical switches 18*a*–18*c* of the optical signal input parts 16*a*–16*d* and the optical switches 40*a*–40*c* of the optical signal output parts 38*a*–38*d*.

An electric signal indicating the completion of the transmission of the optical signal is inputted to the opto-electronic integrated circuit device 100*a* via the electric signal input part 56*c*. The control part 52 of the opto-electronic integrated circuit device 100*a* resets the settings of the optical switches 18*a*–18*c* of the optical signal input parts 16*a*–16*d* and the optical switches 40*a*–40*c* of the optical signal output parts 38*a*–38*d*.

Thus, the optical signal outputted from the opto-electronic integrated circuit device 100*a* is transmitted to the opto-electronic integrated circuit device 100*g* via the opto-electronic integrated circuit device 100*b* and the opto-electronic integrated circuit device 100*c*.

Then, the case that when data in an optical signal is transmitted from the opto-electronic integrated circuit device 100*a* to the opto-electronic integrated circuit device 100*g*, the optical signal cannot go by way of the opto-electronic integrated circuit device 100*c* will be explained.

First, the steps of the opto-electronic integrated circuit device 100*b* outputting an optical signal to the opto-electronic integrated circuit device 100*c* so as to demand the permission of the input of the optical signal of the opto-electronic integrated circuit device 100*c* including this step are the same as described above, and their explanation will be omitted.

In the case that when the opto-electronic integrated circuit device 100*b* demands the permission of the input of the optical signal of the opto-electronic integrated circuit device 100*c*, the opto-electronic integrated circuit device 100*c* does not permit the input of the optical signal, the control part 52 of the opto-electronic integrated circuit device 100*b* judges whether or not the optical signal inputted from the optical signal input part 16*a* of the input/output port 36*a* can be outputted from the optical signal output part 38*b* of the input/output port 36*b* via the optical waveguide 50. When the optical signal inputted from the optical signal input part 16*a* of the input/output port 36*a* can be outputted from the optical signal output part 38*b* of the input/output port 36*b* via the optical waveguide 50, the control part 52 of the opto-electronic integrated circuit device 100*b* outputs to the opto-electronic integrated circuit device 100*f* an optical signal demanding the permission of the input of the optical signal.

The header of the optical signal inputted to the opto-electronic integrated circuit device 100*f* contains data indicating that the data is to be processed by the opto-electronic integrated circuit device 100*g*. The control part 52 of the opto-electronic integrated circuit device 100*f* judges whether or not the optical signal inputted from the optical signal input part 16*d* of the input/output port 36*d* can be outputted from the optical signal output part 38*c* of the input/output port 36*c* and, when possible, outputs to the opto-electronic integrated circuit device 100*g* an optical signal demanding the permission of the input of the optical signal.

The header of the optical signal inputted to the opto-electronic integrated circuit 100*g* contains data indicating that the data is to be processed by the opto-electronic integrated circuit device 100*g*. The control part 52 of the opto-electronic integrated circuit 100g recognizes that the inputted optical signal is to be processed by the opto-electronic integrated circuit device 100g. When the opto-electronic integrated circuit device 100g can receive the optical signal, the control part 52 of the opto-electronic integrated circuit device 100g outputs an electric signal indicating the permission of the input of the optical signal to the opto-electronic integrated circuit device 100f via the electric signal output part 54a.

The electric signal outputted from the electric signal output part 54a of the opto-electronic integrated circuit device 100g is inputted to the electric signal input part 56c of the opto-electronic integrated device 100f. The control part 52 of the opto-electronic integrated circuit device 100f reads the electric signal inputted to the electric signal input part 56c and recognizes that the opto-electronic integrated circuit device 100f has permitted the input of the optical signal. The control part 52 of the opto-electronic integrated circuit device 100f changes over the optical switches 18a–18d of the optical signal input part 16d and the optical switches 40a–40c of the optical signal output part 38c so that the optical signal inputted from the optical signal input part 16d of the input/output port 36d is outputted from the optical signal output part 38c of the input/output port 36c. Then, the control part 52 of the opto-electronic integrated circuit device 100f outputs an electric signal indicating the permission of the input of the optical signal to the opto-electronic integrated circuit device 100b via the electric signal output part 54d.

The electric signal outputted from the electric signal output part 54d of the opto-electronic integrated circuit device 100f is inputted to the electric signal input part 56b of the opto-electronic integrated circuit device 100b. The control part 52 of the opto-electronic integrated circuit device 100b reads the electric signal inputted via the electric signal input part 56b and recognizes that the opto-electronic integrated circuit 100f and the opto-electronic integrated circuit device 100g have permitted the input of the optical signal. The control part 52 of the opto-electronic integrated circuit device 100b changes over the optical switches 18a–18c of the optical signal input part 16a and the optical switches 40a–40c of the optical signal output part 38b so that the optical signal inputted from the optical signal input part 16a of the input/output port 36a is outputted from the optical signal output part 38b of the input/output port 36b. The control part 52 of the opto-electronic integrated circuit device 100b outputs to the opto-electronic integrated circuit device 100a an electric signal indicating the permission of the input of the optical signal via the electric signal output part 54a.

The control part 52 of the opto-electronic integrated circuit device 100a reads the electric signal inputted via the electric signal input part 56c and recognizes that the opto-electronic integrated circuit 110b, the opto-electronic integrated circuit device 100f and the opto-electronic integrated circuit 100g have permitted the input of the optical signal. The control part 52 of the opto-electronic integrated circuit device 100a sets the optical switches 40a–40c of the optical signal output part 38c so that an electric signal outputted from the semiconductor chip 30 is converted to the optical signal by the electric-optic conversion element 46c and outputted from the optical signal output part 38c.

The semiconductor element 30 outputs an electric signal. The electric signal outputted from the semiconductor chip 30 is converted to an optical signal by the electric-optic conversion element 46c to be outputted via the optical signal output part 38c of the input/output port 36c. The optical signal outputted from the input/output port 36c of the opto-electronic integrated circuit device 100a is inputted to the opto-electronic integrated circuit device 100g via the opto-electronic integrate circuit 100b and the opto-electronic integrate circuit device 100f. The optical signal transmitted to the opto-electronic integrated circuit device 100g is subjected to required processing by the semiconductor chip 30, etc. mounted on the opto-electronic integrated circuit device 100g.

The optical signal contains data indicating the tail of the optical signal. The opto-electronic integrated circuit device 100g receives the data indicating the tail of the optical signal and outputs an electric signal indicating the completion of the transmission of the optical signal to the opto-electronic integrated circuit device 100f via the electric signal output part 54a so as to inform the opto-electronic integrated circuit device 100f of the completion of the transmission of the optical signal. The control part 52 of the opto-electronic integrated circuit device 100g resets the settings of the optical switches 18a–18c of the optical signal input parts 16a–16d and the optical switches 40a–40c of the optical signal output parts 38a–38d.

An electric signal indicating the completion of the transfer of the optical signal is inputted to the opto-electronic integrated circuit device 100f via the electric signal input part 56c. The opto-electronic integrated circuit device 100f outputs an electric signal indicating the completion of the transfer of the optical signal to the opto-electronic integrated circuit device 100b via the electric signal output part 54d so as to inform the opto-electric integrated circuit device 100b of the completion of the transfer of the optical signal. The control part 52 of the opto-electronic integrated circuit device 100f resets the settings of the optical switches 18a–18c of the optical signal input parts 16a–16d and the optical switches 40a–40c of the optical signal output parts 38a–38d.

An electric signal indicating the completion of the transfer of the optical signal is inputted to the opto-electronic integrated circuit device 10ob via the electric signal input part 54b. The opto-electronic integrated circuit device 100b outputs an electric signal indicating the completion of the transfer of the optical signal to the opto-electronic integrated circuit device 100a via the electric signal output part 54a so as to inform the opto-electric integrated circuit device 100a of the completion of the transfer of the optical signal. The control part 52 of the opto-electronic integrated circuit device 100b resets the settings of the optical switches 18a–18c of the optical signal input parts 16a–16d and the optical switches 40a–40c of the optical signal output parts 38a–38d.

An electric signal indicating the completion of the transmission of the optical signal is inputted to the opto-electronic integrated circuit device 100a via the electric signal input part 54c. The control part 52 of the opto-electronic integrated circuit device 100a resets the settings of the optical switches 18a–18c of the optical signal input parts 16a–16d and the optical switches 40a–40c of the optical signal output parts 38a–38d.

As described above, even when an optical signal cannot be transmitted via the opto-electronic integrated circuit device 100c, the optical signal outputted from the opto-electronic integrated 100a can be transmitted to the opto-electronic integrated circuit device 100g via the opto-electronic integrated circuit device 100b and the opto-electronic integrated circuit device 100f.

When an optical signal is transmitted, e.g., from the opto-electronic integrated circuit 100a to the opto-electronic integrated circuit 100p, the optical signal often goes on attenuating while passing through a number of the optical switches 18a–18c, 40a–40c, the optical waveguides 50, 104, etc. In the case that an optical signal is transmitted through a number of the opto-electronic integrated circuits 100, the following processing may be performed in any one of the opto-electronic integrated circuit devices 100 to be passed through in the transmission.

That is, an optical signal inputted from one optical signal input part 16 is converted to an electric signal by the opto-electric conversion element 26. Then, the converted electric signal is converted to an optical signal by the electric-optic conversion element 46. Then, the converted optical signal is outputted from the optical signal output part 38 of the input/output port 36.

Which opto-electronic integrated circuit devices 100 perform the above-described processing may be decided, based on a number of the stages, etc. of the optical switches 18a–18c, 40a–40c to be passed through in the optical transmission.

This processing can amplify attenuated optical signals even in transmitting the optical signals via a number of the opto-electronic integrated circuit devices 100. Thus, even in the optical transmission via a number of the opto-electronic integrated circuit devices 100, an optical signal can be transmitted without failure.

As described above, according to the present invention, when an inputted optical signal is to be processed by an opto-electronic integrated circuit device the optical signal has been inputted to, the inputted optical signal can be converted to an electric signal and inputted to the semiconductor chip, etc. When an inputted optical signal is to be processed by another opto-electronic integrated circuit device, the optical switches are changed over to thereby transmit the inputted optical signal as it is to said another opto-electronic integrated circuit device. Thus, according to the present embodiment, a number of optical waveguides, the electric-optic conversion elements and the opto-electric conversion elements are not necessary, and the opto-electronic integrated circuit system can be small sized. Furthermore, when an optical signal is to be processed by another opto-electronic integrated circuit device, the optical signal is not converted to an electric signal by the opto-electronic integrated circuit device or an electric signal is not converted to an optical signal by the opto-electronic integrated circuit device, whereby the delay of the transfer speed can be prevented. Thus, according to the present embodiment, even when an optical signal is transmitted between a number of opto-electronic integrated circuit devices, the delay of the signal can be prevented, and the opto-electronic integrated circuit system can be small-sized.

According to the present embodiment, when an optical signal is transferred via a number of opto-electronic integrated circuit devices, the optical signal is converted to an electric signal in the opto-electronic integrated circuit devices to be passed through in the transmission, whereby the attenuated optical signal can be amplified. Thus, the opto-electronic integrated system can be large-scaled enough for an optical signal to pass through a number of opto-electronic integrated circuit devices.

According to the present embodiment, an optical signal is to be processed by another opto-electronic integrated circuit device, an opto-electronic integrated circuit device does not need convert the optical signal to an electric signal and the electric signal to an optical signal, which can reduce the load of the processing in the opto-electronic integrated circuit device.

According to the present embodiment, when an optical signal is to be processed by another opto-electronic integrated circuit, the conversion of optical signal to an electric signal and the conversion of the electric signal to an optical signal are not performed by the opto-electronic integrated circuit devices the optical signal has been inputted to, whereby the electric power saving can be realized.

[Modified Embodiments]

The present invention is not limited to the above-described embodiment and can cover other various modifications.

For example, in the above-described embodiment, the opto-electronic integrated circuit device includes four input/output ports but is not essentially four. The number of the input/output ports can be less or more than four. For example, eight input/output ports maybe provided. When the number of the input/output ports is $2^n$, the optical switches 18a–18c, 40a–40c are cascade connected in n stages.

In the above-described embodiment, a number of the opto-electronic integrated circuit devices 100 are provided on one and the same substrate 102 but may not provided on one and the same substrate 102.

What is claimed is:

1. An opto-electronic integrated circuit device comprising:
    an optical switch disposed in an input port of a first input/output port over a substrate, and changing over an optical path of an optical signal inputted from the input port and outputting the optical signal from any one of a plurality of output terminals;
    an opto-electric conversion element optically connected to one of the plural output terminals of the optical switch, and converting the optical signal outputted from said one output terminal of the optical switch to an electric signal and inputting the converted electric signal into a semiconductor element mounted over the substrate;
    an optical waveguide optically connected to another of the plural output terminals of the optical switch and outputting the optical signal outputted from said another output terminal of the optical switch through an output port of a second input/output port over the substrate; and
    a control part for controlling the optical switch to chance over the optical path of the optical signal,
    wherein the control part judges whether or not to permit the input of an optical signal to the input port of the first input/output port and outputs an electric signal indicating permission or prohibition of the input of the optical signal through the first input/output port.

2. An opto-electronic integrated circuit device comprising:
    an optical switch disposed in an input port of a first input/output port over a substrate and changing over an optical path of an optical signal inputted from the input port and outputting the optical signal from any one of a plurality of output terminals;
    an opto-electric conversion element optically connected to one of the plural output terminals of the optical switch, and converting the optical signal outputted from said one output terminal of the optical switch to an electric signal and inputting the converted electric signal into a semiconductor element mounted over the substrate;
    an optical waveguide optically connected to another of the plural output terminals of the optical switch, and outputting the optical signal outputted from said another output terminal of the optical switch through an output port of a second input/output port over the substrate;

an electric-optic conversion element converting an electric signal outputted from the semiconductor element to an optical signal and outputting the converted optical signal through the output port of the second input/output port; and a control part for controlling the optical switch to chance over the optical path of the optical signal, wherein the control part judges whether or not to permit the input of an optical signal to the input port of the first input/output port and outputs an electric signal indicating permission or prohibition of the input of the optical signal through the first input/output port.

3. An opto-electronic integrated circuit device comprising:

an optical switch disposed in an input port of a first input/output port over a substrate and changing over an optical path of an optical signal inputted from the input port and outputting the optical signal from any one of a plurality of output terminals:

an opto-electric conversion element optically connected to one of the plural output terminals of the optical switch, and converting the optical signal outputted from said one output terminal of the optical switch to an electric signal and inputting the converted electric signal into a semiconductor element mounted over the substrate;

an optical waveguide optically connected to another of the plural output terminals of the optical switch, and outputting the optical signal outputted from said another output terminal of the optical switch through an output port of a second input/output port over the substrate;

an electric-optic conversion element converting an electric signal outputted from the semiconductor element to an optical signal and outputting the converted optical signal through the output port of the second input/output port and a control part for controlling the optical switch to change over the optical oath of the optical signal, wherein an optical signal inputted from the input port of the first input/output port is converted to an electric signal by the opto-electric conversion element, the converted electric signal is inputted to the electric-optic conversion element via the semiconductor element, the electric signal is converted to an optical signal by the electric-optic conversion element, and the converted optical signal is outputted through the output port of the second input/output port, and the control part judges whether or not to permit the input of an optical signal to the input port of the first input/output port and outputs all electric signal indicating permission or prohibition of the input of the optical signal through the first input/output port.

4. An opto-electronic integrated circuit system comprising a plurality of opto-electronic integrated circuit devices arranged in a matrix, each opto-electronic integrated circuit device including an optical switch disposed in an input port of a first input/output port over a substrate, and changing over an optical path of an optical signal inputted from the input port and outputting the optical signal from any one of a plurality of output terminals; an opto-electric conversion element optically connected to one of the plural output terminals of the optical switch, and converting the optical signal outputted from said one output terminal of the optical switch to an electric signal and inputting the converted electric signal into a semiconductor element mounted over the substrate; an optical waveguide optically connected to another of the plural output terminal of the optical switch, and outputting the optical signal outputted from said another output terminal of the optical switch through an output port of a second input/output port over the substrate; an electric-optic conversion element converting an electric signal outputted from the semiconductor element to an optical signal and outputting the converted optical signal through the output port of the second input/output port; and the control part judging whether or not to permit the input of an optical signal to the input port of the first input/output port, outputting an electric signal indicating permission or prohibition of the input of the optical signal through the first input/output port and controlling the optical switch to change over the optical path of the optical signal, the output port of one of the plural opto-electronic integrated circuit devices and the input port of another of the plural opto-electronic integrated circuit devices being optically interconnected by an optical waveguide, and the control part of said one opto-electronic integrated circuit devices and the control part of said another opto-electronic integrated circuit devices being electrically interconnected by an electric interconnection.

5. A transmission method using an opto-electronic integrated circuit system comprising a plurality of opto-electronic integrated circuit device arranged in a matrix, each opto-electronic integrated circuit device including an optical switch disposed in an input port of a first input/output port over a substrate, and changing over an optical path of an optical signal inputted from the input port and outputting the optical signal from any one of a plurality of output terminals; an opto-electric conversion element optically connected to one of the plural output terminals of the optical switch, and converting the optical signal outputted from said one output terminal of the optical switch to an electric signal and inputting the converted electric signal into the a semiconductor element mounted over the substrate; an optical waveguide optically connected to another of the plural output terminal of the optical switch, and outputting the optical signal outputted from said another output terminal of the optical switch through an output port of a second input/output port over the substrate; an electric-optic conversion element converting an electric signal outputted from the semiconductor element to an optical signal and outputting the converted optical signal through the output port of the second input/output port; and a control part judging whether or not to permit the input of an optical signal to the input port of the first input/output port, outputting an electric signal indicating permission or prohibition of the input of the optical signal through the first input/output port and controlling the optical switch to change over the optical path of the optical signal, the output port of a first opto-electronic integrated circuit device of the plural opto-electronic integrated circuit devices and the input port of a second opto-electronic integrated circuit device of the plural opto-electronic integrated circuits being optically interconnected by an optical waveguide, the output port of the second opto-electronic integrated circuit device and the input port of a third opto-electronic integrated circuit device of the plural opto-electronic integrated circuit devices being optically interconnected by an optical waveguide, the control part of the first opto-electronic integrated circuit device and the control part of the second opto-electronic integrated circuit device being electrically interconnected by an electric interconnection, and the control part of the second opto-electronic integrated circuit device and the control part of the third opto-electronic integrated circuit device being electrically interconnected by an electric interconnection, the method comprising:

the first step of the first opto-electronic integrated circuit device asking the second opto-electronic integrated circuit device for the permission of the input of the optical signal to the input port of the second opto-electronic integrated circuit device;

the second step of the second opto-electronic integrated circuit device asking the third opto-electronic integrated circuit device for the permission of the input of the optical signal to the input port of the third opto-electronic integrated circuit device;

the third step of the control part of third opto-electronic integrated circuit device outputting an electric signal indicating the permission of the input of the optical signal to the control part of the second opto-electric integrated circuit device;

the fourth step of the control part of the second opto-electronic integrated circuit device controlling the optical switch to output the optical signal inputted to the input port through the output port, and outputting an electric signal indicating the permission of the input of the optical signal to the input port to the control part of the first opto-electronic integrated circuit device; and the fifth step of inputting the optical signal outputted from the output port of the first opto-electronic integrated circuit device to the input port of the third opto-electronic integrated circuit device via the input port and the output port of the second opto-electronic integrated circuit device.

6. A transmission method according to claim 5 in which in the fifth step, the optical signal outputted from the first opto-electronic integrated circuit device contains data indicating the tail of the optical signal, and the method further comprises:

the sixth step of the control part of the third opto-electronic integrated circuit device, after the third opto-electronic integrated circuit device has received the data indicating the tail, outputting an electric signal indicating the completion of the transmission of the optical signal to the control part of the second opto-electronic integrated circuit device; and the seventh step of the control part of the second opto-electronic integrated circuit device outputting the electric signal indicating the completion of the transmission of the optical signal to the control part of the first opto-electronic integrated circuit device.

* * * * *